United States Patent [19]
Allen

[11] Patent Number: 6,084,426
[45] Date of Patent: Jul. 4, 2000

[54] COMPENSATED INPUT RECEIVER WITH CONTROLLED SWITCH-POINT

[75] Inventor: Michael J. Allen, Rescue, Calif.

[73] Assignee: Intel Corporation, Santa Clara, Calif.

[21] Appl. No.: 08/998,293

[22] Filed: Dec. 24, 1997

[51] Int. Cl.$^7$ .......................... H03K 17/16; H03K 19/003
[52] U.S. Cl. ............................... 326/31; 326/30; 326/34; 326/87
[58] Field of Search ................................. 326/30, 31, 32, 326/33, 34, 83, 86, 87, 121

[56] References Cited

U.S. PATENT DOCUMENTS

| 5,117,124 | 5/1992 | Dickie . | |
|---|---|---|---|
| 5,134,311 | 7/1992 | Biber et al. | 307/270 |
| 5,214,319 | 5/1993 | Abdi . | |
| 5,254,883 | 10/1993 | Horowitz et al. | 307/443 |
| 5,373,400 | 12/1994 | Kovacs . | |
| 5,465,059 | 11/1995 | Pan et al. . | |
| 5,576,842 | 11/1996 | Choi . | |

*Primary Examiner*—Michael Tokar
*Assistant Examiner*—Daniel D. Chang
*Attorney, Agent, or Firm*—Leo V. Novakoski

[57] ABSTRACT

A compensated CMOS receiver includes an inverter, at least one compensation transistor coupled between a first voltage and the output of the inverter, a comparison circuit coupled to the output of the inverter, and a control circuit coupled to the comparison circuit and the compensation transistor. When the receiver is driven to a calibration state, the comparison circuit generates an output signal that reflects the difference between the inverter's output voltage and a switch-point reference. The control circuit adjusts the one or more compensation transistors according to the difference signal generated by the comparison circuit.

16 Claims, 5 Drawing Sheets

6,084,426

COMPENSATED INPUT RECEIVER WITH CONTROLLED SWITCH-POINT

RELATED PATENT APPLICATIONS

This invention is related to U.S. Patent Application Ser. No. 08/777,524, entitled Dual Reference Voltage Input Receiver For High Speed Data Transmission and filed on Dec. 20, 1996.

BACKGROUND OF THE INVENTION

1. Technical Field

This invention relates to the field of receiver circuits having switch-points for discriminating between the logic states of received signals, and in particular to receiver circuits having adjustable switch-point voltages.

2. Related Art

The central processing units (CPUs) of computers operate at ever increasing frequencies. To take advantage of this increased speed, buses and interface circuits must couple data to and from CPUs at higher speeds. However, transmitting data over bus connections at high frequencies generates relatively noisy signals, and the receiver circuits that couple devices to buses must be able to extract data from noisy signals quickly and accurately. In the digital realm, a receiver's accuracy reflects its ability to discriminate between signals in different logic states, which are represented by different voltage levels on the bus traces. The vast majority of these digital systems employ two voltage states to represent true and false logic states. A voltage level above a threshold or switch-point is assigned to one logic state, and a voltage level below the switch-point is assigned to the second logic state.

One source of inaccuracy in receiver circuits is the tendency of the switch-point voltage to vary with time, temperature, or processing conditions. Generally, where switching voltages must be maintained within tight tolerances, differential receivers are employed because their switch-points can be controlled more accurately than those of, for example, CMOS receivers. However, differential receivers are slower and consume more power than CMOS based circuits. In addition, they require an extra pin to couple an external reference voltage to the receiver.

Despite the speed and power advantages of CMOS technology, it has not been applied to high speed receivers with much success. This is due in large part to the difficulty in controlling switch point voltages to high tolerances in CMOS based receivers. For example, the switch point voltages on known CMOS receivers typically have tolerances of ±300 millivolts (mV). On the other hand, high speed, low power systems suitable for state of the art computer systems require tolerances on the order of a few tens of mVs. One known CMOS circuit incorporates circuitry to offset process variations in N-channel devices and partially mask P-channel process variations. However, this compensation scheme is static and does not compensate for variations in the switch point with time or temperature. Consequently, it does not provide compensation at the required tolerances.

SUMMARY OF THE INVENTION

The present invention is a system and method for adjusting the properties of a CMOS receiver to maintain the switch-point of the receiver within a prescribed tolerance. The CMOS receiver includes an inverter with one or more compensation legs and a feedback loop that activates or deactivates the compensation leg(s) according to the inverter's behavior in a calibration state.

In accordance with the present invention, a compensated CMOS receiver includes an inverter, at least one compensation transistor coupled between a first voltage and the output of the inverter, a comparison circuit coupled to the output of the inverter, and a control circuit coupled to the comparison circuit and the compensation transistor. When the receiver is driven to a calibration state, the comparison circuit generates an output signal that reflects the difference between the inverter's output voltage and a switch-point reference. The control circuit adjusts the one or more compensation transistors according to the difference signal generated by the comparison circuit.

BRIEF DESCRIPTION OF THE DRAWINGS

The present invention may be understood with reference to the following drawings in which like elements are indicated by like numbers. These drawings are provided to illustrate possible embodiments of the present invention. In this regard, they are exemplary and are not intended to limit the scope of the invention.

DETAILED DESCRIPTION OF THE INVENTION

The following discussion sets forth numerous specific details to provide a thorough understanding of the invention. However, those of ordinary skill in the art, having the benefit of this disclosure, will appreciate that the invention may be practiced without these specific details. In addition, various well known methods, procedures, components, and circuits have not been described in detail in order to focus attention on the features of the present invention.

The present invention employs a feedback circuit and an inverter with selectable compensation legs (adjustable inverter) to provide a compensated receiver circuit having a tightly controllable switch-point voltage (SPV). The receiver circuit calibrates its current (operative) SPV relative to a reference SPV. The calibration may be done periodically, e.g. on reset, without disrupting circuit operation. The compensation leg(s) of the inverter circuit may be configured to provide fine and course adjustments, as needed to maintain the operative SPV within a selected tolerance of the reference SPV.

Figure 1:
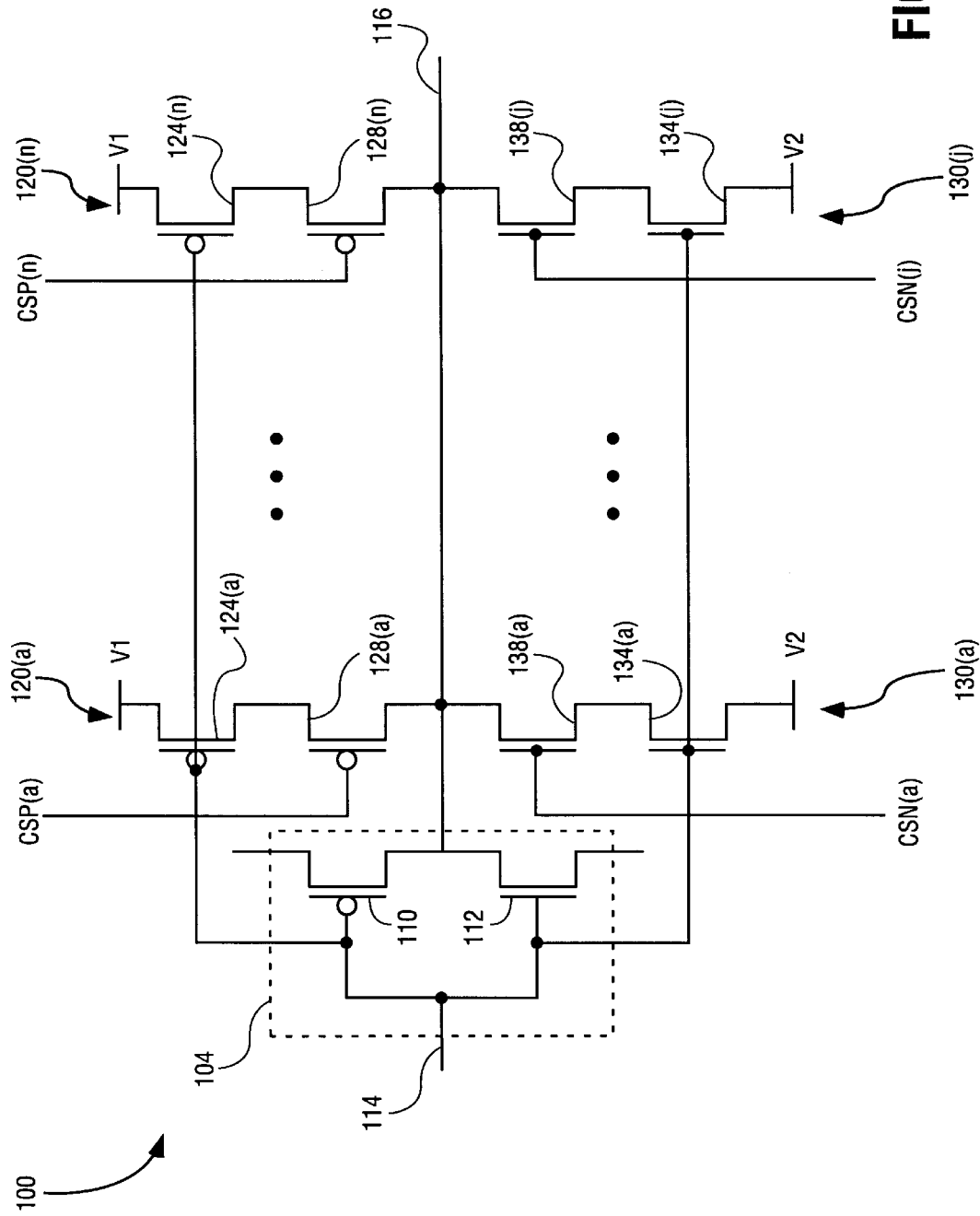
FIG. 1 is a schematic diagram of an inverter circuit, including compensation legs, for use in a compensated receiver circuit in accordance with the present invention.

Referring now to FIG. 1, there is shown an adjustable inverter 100 suitable for use in the present invention. Inverter 100 comprises a pair of complementary transistors 110, 112, the gates of which are coupled to form an input 114 and the drains of which are coupled to form an output 116. Compensation legs 120(a)–120(n) couple output 116 to a first reference voltage, V1, and compensation legs 130(a)–130(j) couple output 116 to a second reference voltage, V2. V1 and V2 are typically $V_{CC}$ and ground, respectively.

Compensation legs 120(a)–120(n) and 130(a)–130(j) control the current available to drive transitions of output 116 in response to voltage changes at input 114. In the following discussion, indices are dropped from references to compensation legs 120, 130, their component transistors, and other devices unless the comments are directed to a specific compensation leg, component transistor, or device, respectively.

In the disclosed embodiment, each compensation leg 120 includes P-type transistors 124, 128 coupled in series between output 116 and V1. The gate of transistor 124 is coupled to input 114, and the gate of transistor 128 is coupled to receive a control signal, CSP. Similarly, each compensation leg 130 includes N-type transistors 134, 138 coupled in series between output 116 and V2. The gate of transistor 134 is coupled to input 114, and the gate of transistor 138 is coupled to receive a control signal, CSN.

In adjustable inverter 100, transistors 124 and 134 are turned on and off along with inverter transistors 110 and 112, respectively. The coupling between output 116 and reference voltages V1 and V2 is determined by the states of transistors 128 and 138, respectively. In particular, the current flowing into the node at output 116 increases as additional compensation legs 120 are activated, i.e. as additional transistors 128 are turned on by control signals CSP. Similarly, the current flowing out of the node at output 116 increases as additional compensation legs 130 are activated. The operative SPV of adjustable inverter 100 is the voltage at which the current flowing into output 116 from transistor 110 and any activated compensation legs 120 exceeds the current flowing out of output 116 through transistor 112 and any activated compensation legs 130. That is, the operative SPV corresponds to the voltage at input 114 for which the net current flow into the node at output 116 is zero. For example, for downward transitions at input 114, the switch-point occurs when the current into output node 116 through transistor 110 and compensation legs 120 just exceeds the current out of output node 116 through transistor 112 and compensation legs 130. The operative SPV of adjustable inverter 100 may thus be controlled by activating and deactivating compensation leg(s) 120 and 130, as needed, to increase the current flow into or out of the node at output 116 for a given voltage at input 114.

In accordance with the present invention, a compensated receiver (FIG. 2) is formed with adjustable inverter 100 and a feedback circuit that includes comparison and control circuits. Periodically, adjustable inverter 100 is driven to a calibration state that provides an indication of the operative SPV output 116. The feedback circuit monitors this indication and selectively activate compensation legs 120, 130 accordingly. In one embodiment of the invention, the calibration state of adjustable inverter 100 drives the operative SPV on output 116. In another embodiment, the calibration state drives output 116 to a high or low voltage state, according to whether or not the operative SPV exceeds the reference SPV. In each case, a signal indicating the difference between the operative and reference SPVs is generated and used to adjust the compensation legs to reduce the difference.

While adjustable inverter 100 has been described with both P and N type compensation legs 120, 130, respectively, it is noted that inverter transistors 110, 112 can be sized to bias the SPV of inverter 104 towards one or the other reference voltage, V1, V2. In this case, adjustable inverter 100 may be implemented using one or more compensation legs of a single conductivity type. The size and conductivity type of the compensation leg(s) are selected to offset the built-in bias of inverter transistors 110, 112 as additional compensation legs are activated. For example, by selecting a relatively large N-type transistor 112, compensation legs 130 may be eliminated and the switch-point voltage of receiver 100 adjusted with compensation legs 120 comprising P-type transistors 124, 128.

Figure 2:
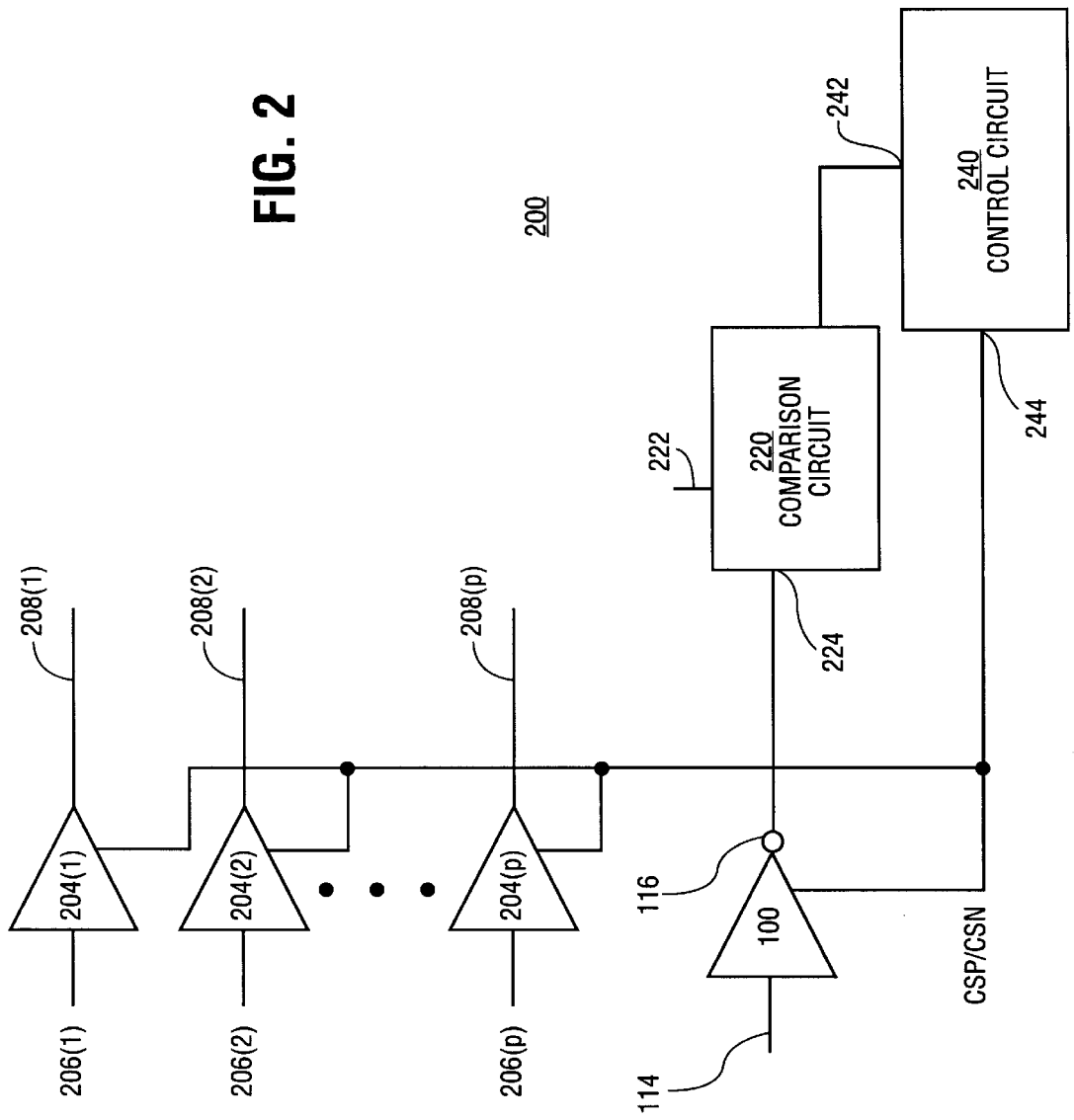
FIG. 2 is a block diagram of one embodiment of a compensated receiver circuit in accordance with the present invention.

Referring now to FIG. 2, there is shown a block diagram of one embodiment of a compensated receiver 200 incorporating adjustable inverter 100 of FIG. 1. Receiver 200 comprises adjustable inverter 100, a comparison circuit 220, and a control circuit 240. Comparison circuit 220 includes a first input 222 for receiving a first reference voltage and a second input 224 coupled to output 116 of adjustable receiver 100. The first reference voltage is the reference SPV or a voltage derived from the reference SPV. Control circuit 240 has an input 242 coupled to receive a signal from comparison circuit 220 and an output 244 coupled to compensation leg(s) 120, 130 of adjustable inverter 100 through control signal lines CSP/CSN.

During calibration, adjustable inverter 100 is configured to drive output 116 to a calibration voltage. Depending on the particular configuration of receiver 200, the calibration voltage may be the operative SPV or it may be a high/low voltage indicating the larger of the operative and reference SPVs. Comparison circuit 220 monitors output 116 and generates a signal that represents the difference between the operative and reference SPVs. This signal is coupled to control circuit 240, which generates compensation signals on control lines CSP/CSN to activate or deactivate compensation leg(s) 120, 130 accordingly. In particular, control circuit 240 adjusts compensation legs 120, 130 to offset any difference between the operative and reference SPVs indicated by comparison circuit 220.

The disclosed embodiment of compensated receiver 200 also includes inverters 204(l)–204(p). Inverters 204(l)–204(p) couple signals received at inputs 206(l)–206(p) onto data lines 208(l)–208(p), respectively, for further processing. Compensation signals generated by receiver 200 during calibration are applied to inverters 204(l)–204(p) during normal operation, e.g. data processing. Inverters 204 are structurally similar to adjustable inverter 100. That is, they comprise transistors and compensation legs formed from transistors that are sized and configured comparably to transistors 110, 114 and 124, 128, 134, 138, respectively, of inverter 100. This ensures that compensation signals generated by control circuit 240 are suitable for adjusting the SPVs of the data handling inverters 204(l)–200(p).

Figure 3:
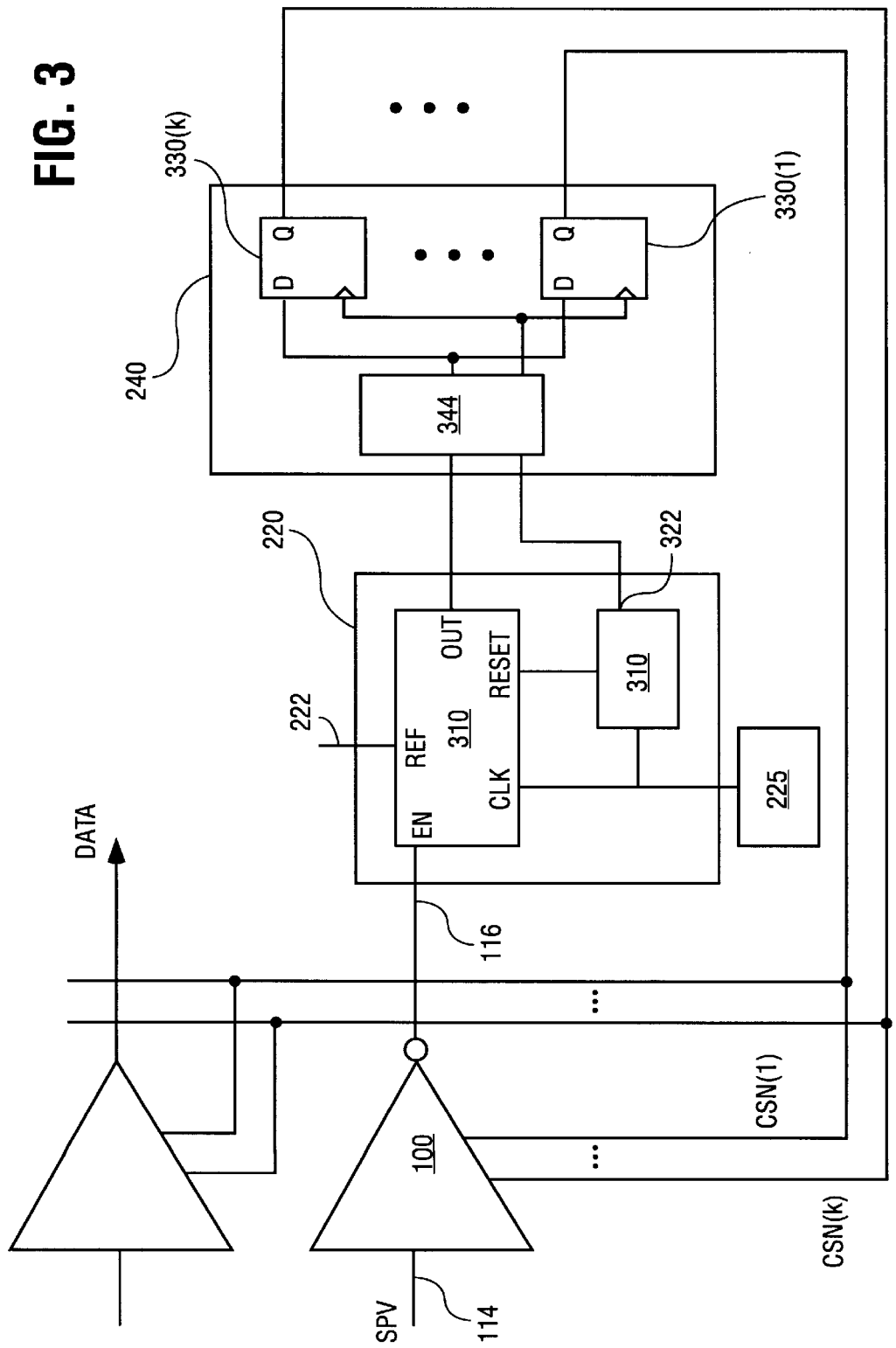
FIG. 3 is a schematic diagram of one embodiment of the comparison and control circuits of FIG. 2.

FIG. 3 shows embodiments of comparison circuit 220 and control circuit 240 suitable for generating compensation signals in the manner described above. In this embodiment of compensated receiver 200, the calibration state is initiated by applying the reference SPV to input 114 of adjustable inverter 100. This drives output 116 to a high or a low voltage state, depending on whether the operative SPV of adjustable inverter 100 is greater or less than the reference SPV. Comparison circuit 220 samples the relative voltages of reference and operations SPVs over a sequence of clock cycles and control circuit 240 adjusts the compensation signals according to the results of the sample.

The disclosed embodiment of comparison circuit 220 includes an up/down or multi-mode counter 310 and a divide-by-N counter 320. Multi-mode counter 310 includes an enable input (EN) coupled to output 116, a clock input (CLK) coupled to receive a clock signal, an output (OUT) coupled to control circuit 240, and a reset input (RESET) coupled to an output 322 of divide-by-N counter 320. The reference SPV is applied to input 222 (REF) for determining the relative voltage level at EN. Divide-by-N counter 320 is coupled to receive the clock signal and provide an output signal every N cycles of the clock signal.

In one embodiment of control circuit 220, multi-mode counter 310 is a synchronous counter that counts up or down on each clock cycle, depending on whether the signal at EN is high or low, respectively, with respect to the reference SPV. Multi-mode counter 310 returns to a standard state when RESET is asserted. OUT provides a signal that indicates, for example, the net number of times the operative SPV exceeded the reference SPV in the N samples. The signal at OUT is coupled to control circuit 240, which activates one or more of compensation legs 120, 130 according to the result of the N signal sample.

When the operative SPV of adjustable inverter 100 is equal to the reference SPV, a sample of N signals at output 116 should include an approximately equal number (N/2) of high and low voltage states. If the operative SPV is less than the reference SPV, the reference SPV looks like a high voltage signal at input 114, and inverter 104 drives output 116 low. While signal noise and fluctuations in the operative SPV may cause output 116 to be sampled in high, occasionally, a series of signals at output 116 will include more signals in the low voltage state than in the high voltage state. The number of times output 116 is sampled in the low voltage state approaches the sample size as the reference SPV exceeds the operative SPV by increasing amounts. Conversely, the number of times output 116 is sampled in the high voltage state approaches the sample size as the operative SPV exceeds the reference SPV by increasing amounts. In short, the deviation of the ratio of high to low samples from one indicates the difference between the operative and reference switch-point voltages.

This sampling information, which is captured by comparison circuit 220, is used by control circuit 240 to adjust the compensation legs of receiver 100 in a manner that offsets the difference between the reference and operational SPVs. For example, where OUT indicates that the reference SPV exceeds the operative SPV, control circuit 240 generates control signals (CSP/CSN) for the compensation legs of inverter 100 to increase the operative SPV toward the reference SPV. In this case, control circuit 240 generates control signal that activate additional N-type legs 130 and/or deactivates selected P-type legs 120.

In the disclosed embodiment, control circuit 240 comprises a decoder 344 and latches 330(l)–330(k) (collectively, latches 330). The output of each latch 330 is coupled to activate or deactivate one of compensation legs 120, 130 when the signal at its input (D) is latched to its output (Q). In particular, the outputs of latches 330 drive the gates of transistors 124, 134 on or off. Decoder 344 converts the sampling results from comparison circuit 220 into appropriate input signals for latches 330. Here, appropriate input signals are those that activate/deactivate compensation legs to offset any imbalance between the reference and operative SPVs indicated by the N-clock sample, e.g. to move the ratio of high to low voltages sampled at output 116 in the calibration state towards one.

Operation of compensated receiver 200 is illustrated for the case in which adjustable inverter 100 includes compensation legs 120(1), 120(2) and 130(1), 130(2) (FIG. 1 with n=j=2). Transistors 124(1), 124(2), 134(1), 134(2) have relative sizes 10, 20, 5, and 10, respectively, and are driven by control circuit 240. In particular, latches 330(1)–330(4) are coupled to provide control signals to transistors 124(1), 124(2), 134(1), 134(2), respectively. Inverter transistors 110 and 112 have relative sizes 80 and 30, respectively. The generally larger sizes of the P-type transistors offsets their lower conductivities, relative to the N-type devices. An eight clock sample is considered in the illustrated embodiment.

In eight clock cycles, counter 310 may have any of the values −8, −6, −4, −2, 0, 2, 4, 6, and 8 at OUT, depending on the whether and by how much the operative SPV exceeds the reference SPV. One embodiment of decoder 344 maps values of OUT to latches 310 as indicated in table 1.

TABLE 1

| OUT | latch 310(1) (small P type) | latch 310(2) (large P type) | latch 310(3) (small N type) | latch 310(4) (large N-type) |
|---|---|---|---|---|
| −8 | off | off | on | on |
| −6 | off | off | off | on |
| −4 | on | off | off | on |
| −2 | off | off | on | off |
| 0 | off | off | off | off |
| 2 | on | off | off | off |
| 4 | off | on | on | off |
| 6 | off | on | off | off |
| 8 | on | on | off | off |

Table 1 represents just one of the many possible embodiments of decoder 344. Persons skilled in the art will recognize that different decoders 244 may be designed to provide different mappings between OUT and latches 310, depending on the number of compensation legs 120, 130, latches 330, the sample size (N), and the desired tolerance for the SPV. Similarly, other embodiments of comparison circuit 220 may be used to provide a signal suitable for representing the difference between the operative and references SPVs. For example, another counter-based version of compensated receiver 200 may employ separate single-mode counters for the latches that drive P-type and N-type compensation legs 120, 130.

Comparison circuit 220 and control circuit 240 are triggered by a clock signal (CLK), since counter 310, divider 320, and latches 330 require CLK to operate. In one embodiment of the present invention, calibration cycles may be triggered and terminated through CLK. For example, CLK may be gated to comparison and control circuits 220, 240, respectively, through circuitry 225 (FIG. 3) that monitors a computer system for selected conditions such as power on, reset, absence of bus activity, and various types of time outs. When a selected condition is detected, the monitoring circuitry triggers a calibration cycle by supplying clock signals to comparison and control circuits 220, 240. Since latches 330 retain the values at their data outputs Q when CLK terminates, compensation signals CSP/CSN will not change until the next calibration cycle. Monitoring circuitry 225 may terminate CLK when completion of the calibration cycle is detected or, for example, when indicated by a timer, counter, or similar device.

Another embodiment of compensated receiver 200 may employ an analog-based comparison circuit 220 to directly measure the difference between the operative and reference SPVs. In this embodiment, adjustable inverter 100 drives output 116 to its operative SPV in the calibration state. Comparison circuit 220 includes a comparator (FIG. 4A) to generate a voltage difference signal derived from the difference between the operative SPV and the reference SPV. The difference signal, applied to control circuit 240, activates and deactivates compensation legs 120, 130 as necessary to reduce the difference between the operative and reference SPVs.

Figure 4A:
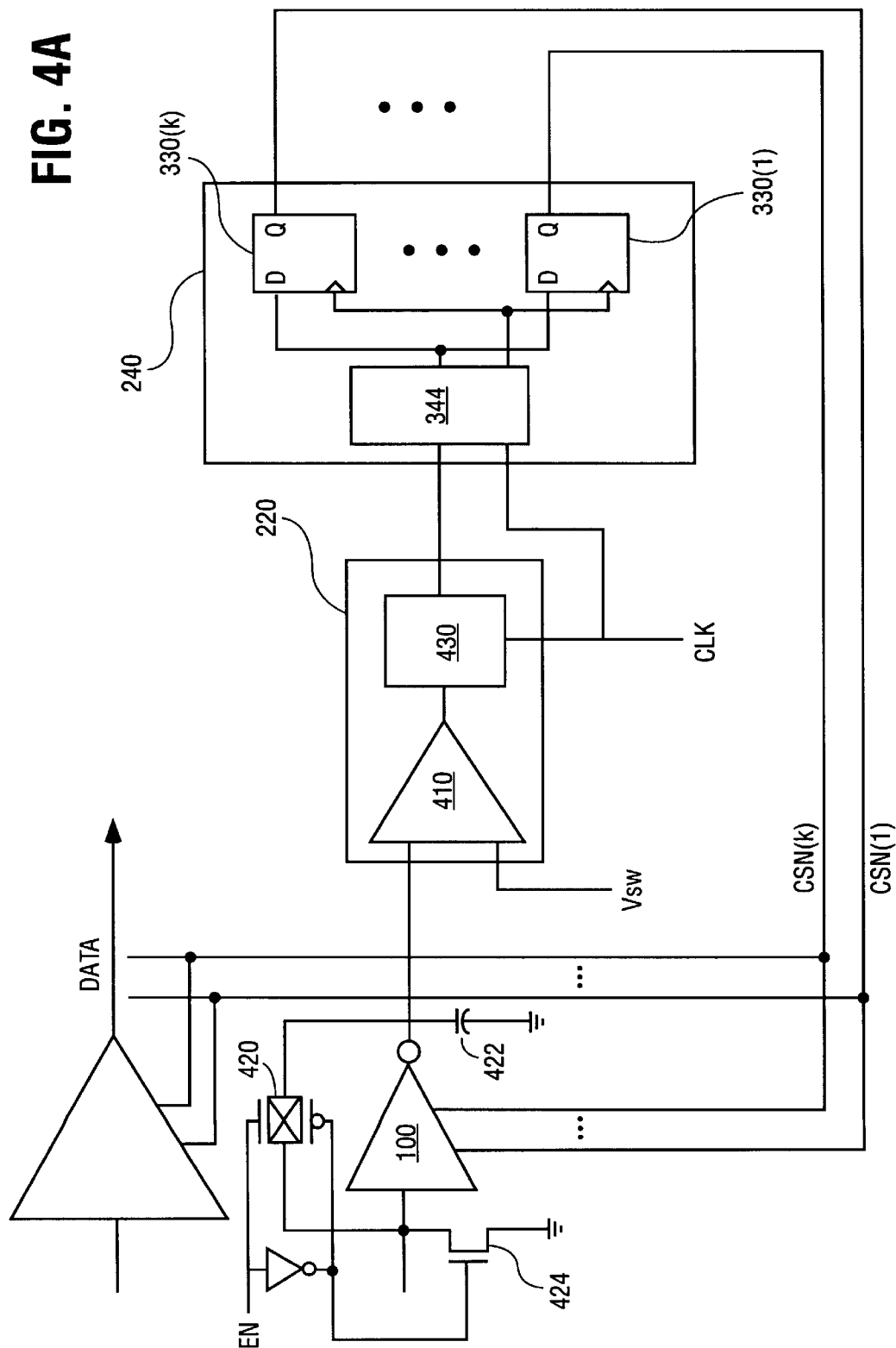
FIG. 4A is a schematic diagram of another embodiment of the comparison and control circuits of FIG. 2.

Referring now to FIG. 4A, there is shown an alternative embodiment of compensated receiver 200 for calibrating adjustable inverter 100 in the manner described above. In this embodiment, comparison circuit 240 comprises a comparator 410 and an analog-to-digital conversion block 430. Comparator 410 has one input coupled to output 116 and a second input coupled to receive the reference SPV. The output of comparator 410 drives conversion block 430, which provides a measure of the difference between the voltage at output 116 and the reference SPV.

In this embodiment of the receiver, the calibration state is controlled by a switch circuit 420 that connects input 114 and output 116 of adjustable inverter 100 when it is enabled. A transistor 424 is coupled between input 114 and ground, and a capacitor 422 is coupled between output 116 and a reference voltage V1 (typically, ground). Switch circuit 420 may be, for example, a transmission gate. Capacitor 422 is selected to be large enough to ensure that output 116 settles to the operative SPV of inverter 100 when switch circuit 420 is closed.

Figure 4B:
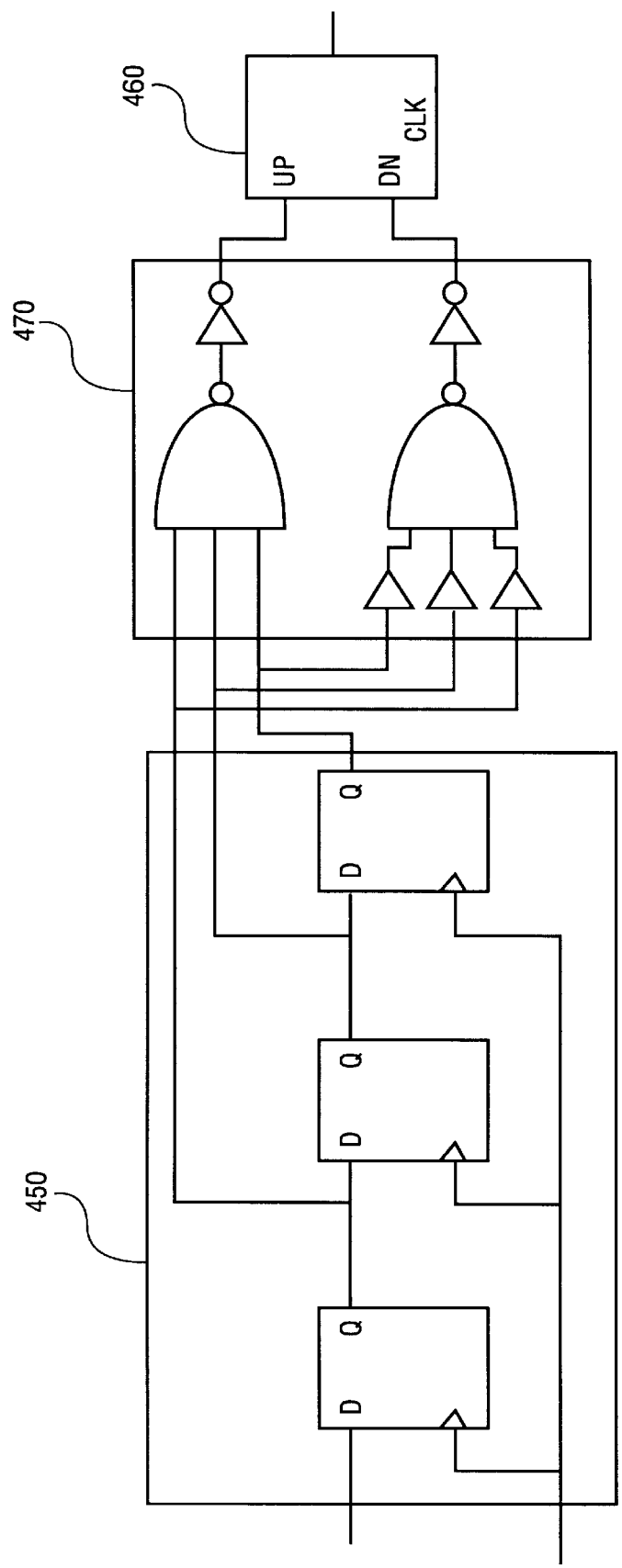
FIG. 4B is a block diagram of the conversion block of FIG. 4A.

Referring now to FIG. 4B, there is shown one embodiment of conversion block 430. The disclosed embodiment includes a 3-bit shift register 450 that is coupled to an UP/DOWN counter 460 through logic block 470. Logic block 470 includes gates to ensure that counter 460 increments or decrements its output (OUT) only when the output of comparator 410 is in the same voltage state high (or low) for three consecutive cycles. This prevents counter 460 from signaling a change to control logic 320 unless the operative SPV of inverter 100 falls consistently above (or below) the reference SPV. Without logic block 470, adjustment of inverter 100 may be jumpy. The use of three consecutive high (or low) readings to signal a change to control logic 430 is not required in the present invention. Control logic 320 may be adjusted on every clock cycle, in which case shift register 450 and logic block 470 can be eliminated. Alternatively, control logic 320 may be adjusted on any convenient number (n) of consistent readings. Control circuits 240 suitable for use with comparison circuit 220 include decoder 344 and latches 330 as discussed above.

There has thus been provided a compensated receiver circuit having a controlled switch-point. The compensated receiver includes an inverter having one or more compensation legs and a feedback circuit that samples the inverter output in a calibration state and adjusts the compensation legs accordingly. The feedback circuit includes a comparison module that monitors the inverter output and generates a signal indicative of any differences between the operative switch point voltage and a reference switch point voltage. A control circuit converts the signal to compensation signals that activate or deactivate compensation legs in the inverter to offset any deviation of the receiver's operative switch-point voltage from the reference switch point voltage.

What is claimed is:

1. A receiver circuit comprising:
   an inverter having an input and an output;
   a compensation transistor coupled between the inverter output and a supply voltage;
   a comparison circuit to compare a voltage at the inverter output with a reference switch point voltage over plural clock cycles and to generate an output signal indicating a difference between the compared voltages over the plural clock cycles; and
   a control circuit to adjust an operative switch point voltage of the inverter by activating or deactivating the compensation transistor responsive to the output signal.

2. The receiver circuit of claim 1, wherein the comparison circuit comprises a counter to adjust a counted value according to the difference between the inverter output voltage and the reference switch point voltage at each of the plural clock cycles.

3. The receiver circuit of claim 2, wherein the comparison circuit further comprises a divide-by-N circuit coupled to a clock signal and to the counter, the divide-by-N circuit to indicate a number of clock cycles for which the inverter output voltage is compared with the reference switch point voltage and wherein the output signal generated by the comparison circuit indicates the counted value following N comparisons.

4. The receiver circuit of claim 3, wherein the compensation transistor comprises a plurality of compensation transistors and the control circuit activates or deactivates one or more compensation transistors according to generated output signal.

5. The receiver circuit of claim 1, wherein the compensation transistor comprises a first plurality of compensation transistors having a first conductivity type.

6. The receiver circuit of claim 5, wherein the plurality of compensation transistors have graded sizes to provide graded adjustments to the inverter's switch-point voltage.

7. The receiver circuit of claim 5, wherein the control circuit comprises a decoder and plurality of latches, the latches having data inputs coupled to the counter through the decoder, clock inputs coupled to the divide-by-N circuit, and data outputs coupled to the compensation transistors, to activate or deactivate the compensation transistors according to the output signal provided by the comparison circuit.

8. The receiver circuit of claim 5, wherein the compensation transistor further comprises a second plurality of compensation transistors having a conductivity type that is complementary to that of the first plurality of transistors.

9. The receiver circuit of claim 1, wherein the comparison circuit comprises an up/down counter and a logic block to adjust the up/down counter in a first direction when the reference switch point voltage exceeds the inverter output voltage for the plural clock cycles.

10. The receiver circuit of claim 9, further comprising a switch circuit coupled between the input and output of the inverter to drive the inverter output to a voltage level that is substantially equal to an operative switch-point voltage of the inverter.

11. The receiver circuit of claim 10, wherein the switch circuit is a pass transistor coupled between the inverter input and output.

12. The receiver circuit of claim 9, further comprising a capacitor coupled between the inverter output and a third reference voltage, to hold the inverter output at the operative switch-point voltage.

13. A circuit comprising:
   a reference inverter to receive an input signal and to generate a voltage at an output responsive to the input signal and an operative switch point voltage of the inverter;
   a compensation transistor connected between a reference voltage and the inverter output;
   a counter to adjust a count value in a first direction if the counter is enabled and the output voltage exceeds a reference switch point voltage and to adjust the count value in a second direction if the counter is enabled and the references switch point voltage exceeds the output voltage;

a control circuit to activate or deactive the compensation transistor responsive to the count value for a sampling interval.

14. The circuit of claim 13, further comprising a divide-by-N counter to indicate to the control circuit if a sampling interval of N clock cycles has elapsed.

15. The circuit of claim 13, wherein the input signal is the reference switch point voltage and the sampling interval is initiated when the reference switch point voltage is applied to the inverter.

16. The circuit of claim 15, further comprising a plurality of inverters that are substantially identical to the reference inverter, each of the plurality of inverter having an associated compensation transistors, each of the compensation transistors to be activated or deactivated by the control circuit.

* * * * *